US012694929B2

(12) United States Patent　(10) Patent No.:　US 12,694,929 B2

Katoch　(45) Date of Patent:　Jul. 28, 2026

---

(54) DUAL TRACKING FOR FLY BIT LINE STATIC RANDOM ACCESS MEMORY (SRAM) ARCHITECTURE

(71) Applicant: Taiwan Semiconductor Manufacturing Company, Ltd., Hsinchu (TW)

(72) Inventor: Atul Katoch, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 84 days.

(21) Appl. No.: 18/756,659

(22) Filed: Jun. 27, 2024

(65) Prior Publication Data

US 2025/0246231 A1　Jul. 31, 2025

Related U.S. Application Data

(60) Provisional application No. 63/626,705, filed on Jan. 30, 2024.

(51) Int. Cl.
*G11C 11/417*　(2006.01)
*G11C 11/412*　(2006.01)
*H03K 19/20*　(2006.01)

(52) U.S. Cl.
CPC .......... *G11C 11/417* (2013.01); *G11C 11/412* (2013.01); *H03K 19/20* (2013.01)

(58) Field of Classification Search
CPC ... G11C 11/417; G11C 11/412; G11C 11/419; G11C 8/12; G11C 7/18; G11C 8/14; H03K 19/20
See application file for complete search history.

(56) References Cited

U.S. PATENT DOCUMENTS

| | | | |
|---|---|---|---|
| 7,733,686 B2 * | 6/2010 | Clinton | .................. G11C 7/227 |
| | | | 365/194 |
| 2012/0051160 A1 * | 3/2012 | Tao | .................. G11C 29/50012 |
| | | | 365/230.03 |

(Continued)

FOREIGN PATENT DOCUMENTS

| | | |
|---|---|---|
| TW | 201209844 A | 3/2012 |
| TW | 202001904 A | 1/2020 |
| TW | 202401263 A | 1/2024 |

OTHER PUBLICATIONS

Office Action issued in Taiwan Appl. No. 113131982 dated Aug. 20, 2025.

*Primary Examiner* — Zhuo H Li

(74) *Attorney, Agent, or Firm* — Foley & Lardner LLP

(57) ABSTRACT

A memory circuit may comprise a memory array, a first tracking cell, a second tracking cell, a first tracking circuit, and a second tracking circuit. A first portion of the memory array may comprise a plurality of first nominal memory cells coupled to a first bit line segment extending along a first lateral direction. A second portion of the memory array may comprise a plurality of second nominal memory cells coupled to a second bit line segment and a third bit line segment both extending along the first lateral direction. The first tracking circuit can be configured to activate the first tracking cell, in response to at least one of the first nominal memory cells being selected. The second tracking circuit can be configured to activate the second tracking cell, in response to at least one of the second nominal memory cells being selected.

20 Claims, 13 Drawing Sheets

(56) References Cited

U.S. PATENT DOCUMENTS

| | | | |
|---|---|---|---|
| 2017/0278555 A1* | 9/2017 | Su | G11C 11/419 |
| 2018/0204609 A1* | 7/2018 | Hsu | G11C 29/50016 |
| 2020/0294580 A1 | 9/2020 | Raj et al. | |
| 2023/0420017 A1* | 12/2023 | Kolar | G11C 11/4096 |
| 2024/0096383 A1* | 3/2024 | Liaw | G11C 7/1096 |

* cited by examiner

400

Second tracking cell
336

First tracking cell
316

330
BL-256

Fly BL
333

CTRL

310
BL-256

M2
335

313

350  MIO

1100

1200

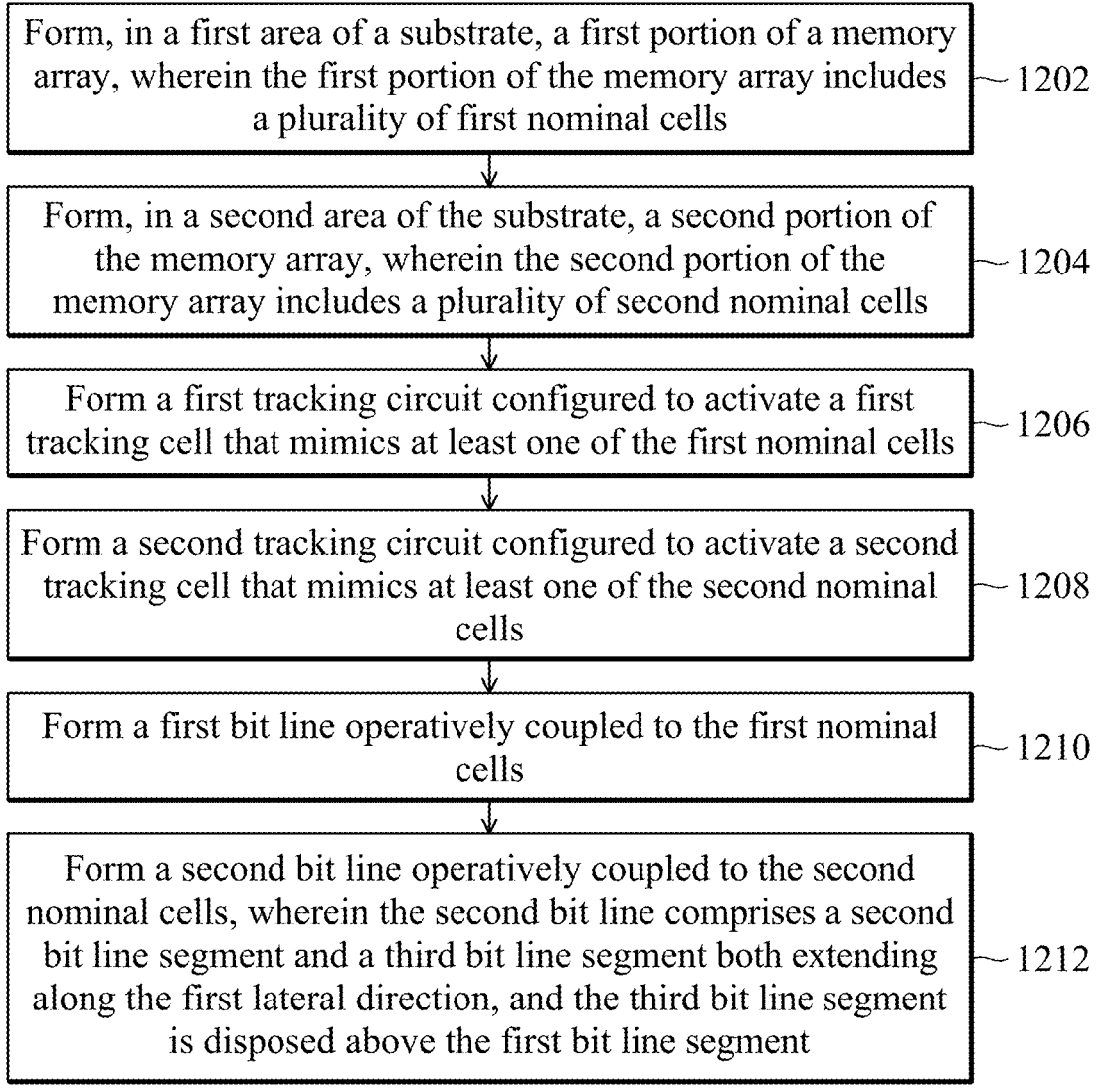

Form, in a first area of a substrate, a first portion of a memory array, wherein the first portion of the memory array includes a plurality of first nominal cells ⎯ 1202

Form, in a second area of the substrate, a second portion of the memory array, wherein the second portion of the memory array includes a plurality of second nominal cells ⎯ 1204

Form a first tracking circuit configured to activate a first tracking cell that mimics at least one of the first nominal cells ⎯ 1206

Form a second tracking circuit configured to activate a second tracking cell that mimics at least one of the second nominal cells ⎯ 1208

Form a first bit line operatively coupled to the first nominal cells ⎯ 1210

Form a second bit line operatively coupled to the second nominal cells, wherein the second bit line comprises a second bit line segment and a third bit line segment both extending along the first lateral direction, and the third bit line segment is disposed above the first bit line segment ⎯ 1212

DUAL TRACKING FOR FLY BIT LINE STATIC RANDOM ACCESS MEMORY (SRAM) ARCHITECTURE

CROSS-REFERENCE TO RELATED APPLICATION

This application claims priority to and the benefit of U.S. Provisional Application No. 63/626,705, filed Jan. 30, 2024, entitled "DUAL TRACKING FOR FLY BL (SRAM) MEMORY ARCHITECTURE," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. The flying bit line scheme is an effective technique for reducing memory area because it allows the periphery to be consolidated in one location.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 is an example method of forming a memory circuit for dual tracking for fly bit line static random access memory (SRAM) architecture in accordance with some embodiments.

DETAILED DESCRIPTION

Figure 1:
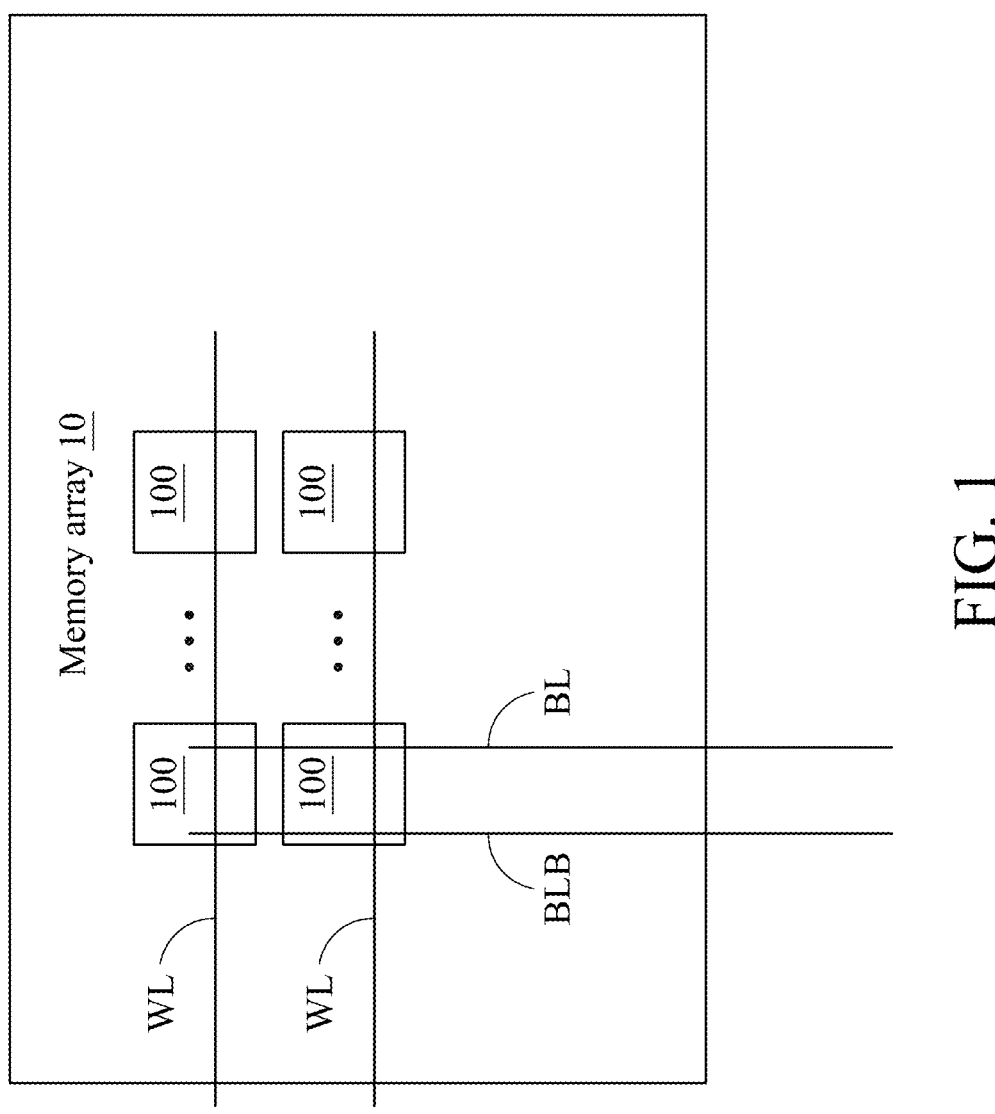
FIG. 1 is a block diagram illustrating an example of a memory array in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The flying bit line (BL) scheme proves effective in reducing memory area by consolidating the periphery into a single location. However, the scheme also introduces higher capacitance and resistance due to the additional metallization layer (e.g., M2 layer) wire bringing the BL to memory I/O. The increased resistance-capacitance (RC) costs extra power and timing. To mitigate this, a shared tracking method is employed to synchronize the timing of the fly BL segment and non-fly BL segment. A timing circuit is tuned to ensure that the read margin and write margin meet the requirements for the fly BL, and the same circuit is used for the non-fly BL segment. Unfortunately, the shared timing circuit results in higher than desired read and write margins for the non-fly BL segment, leading to approximately about 20% higher power consumption for the segment. The active power consumption is calculated as an average of the fly-BL and non-BL segments. Additionally, the word lint (WL) in the upper segment and WL in the lower segment both utilize the same timing signal input clock to maintain synchronization.

The present disclosure provides various embodiments of a memory circuit configured in a dual tracking fly bit line (BL) static random access memory (SRAM) architecture, and designed to resolve the above-identified technical issues without compromising the design constraints. The memory circuit may comprise a memory array, a first tracking cell, a second tracking cell, a first tracking circuit, and a second tracking circuit. A first portion of the memory array may comprise a plurality of first nominal memory cells coupled to a first bit line segment extending along a first lateral direction. The first tracking cell can be disposed next to the first portion of the memory array along a second lateral direction perpendicular to the first lateral direction. A second portion of the memory array may comprise a plurality of second nominal memory cells coupled to a second bit line segment and a third bit line segment both extending along the first lateral direction. The second tracking cell can be disposed next to the second portion of the memory array along the second lateral direction. The first tracking circuit can be configured to activate the first tracking cell, in response to at least one of the first nominal memory cells being selected. The second tracking circuit can be configured to activate the second tracking cell, in response to at least one of the second nominal memory cells being selected. In some embodiments, implementing separate timing circuits for the fly BL and non-fly BL segments allows for precise timing of each segment, eliminating over-margining in the non-fly BL segments. This optimization leads to lower power consumption in the non-fly BL segment, reducing the average power by approximately about 20%. This power-saving benefit is observed for a 512 Kb instance (e.g., 0.5 Mb), where typically, such an instance consumes about 8 uA/MHz of active power. It is worth noting that smaller instances can experience proportionally smaller savings in power consumption.

FIG. 1 is a block diagram illustrating an example of a memory array 10 in accordance with some embodiments. FIG. 1 shows a memory array 10 with a plurality of memory cells 100, or bit-cells 100. One or more peripheral circuits (not shown) may be located at one or more regions peripheral to, or within, the memory array 10. The memory cell 100 and the periphery circuits may be coupled by word lines and/or complementary bit lines BL and BLB, and data can read from and written to the memory cells 100 via the complementary bit lines BL and BLB. Different voltage combinations applied to the word lines and bit lines may define a read, erase or write (program) operation on the memory cells.

Figure 2:
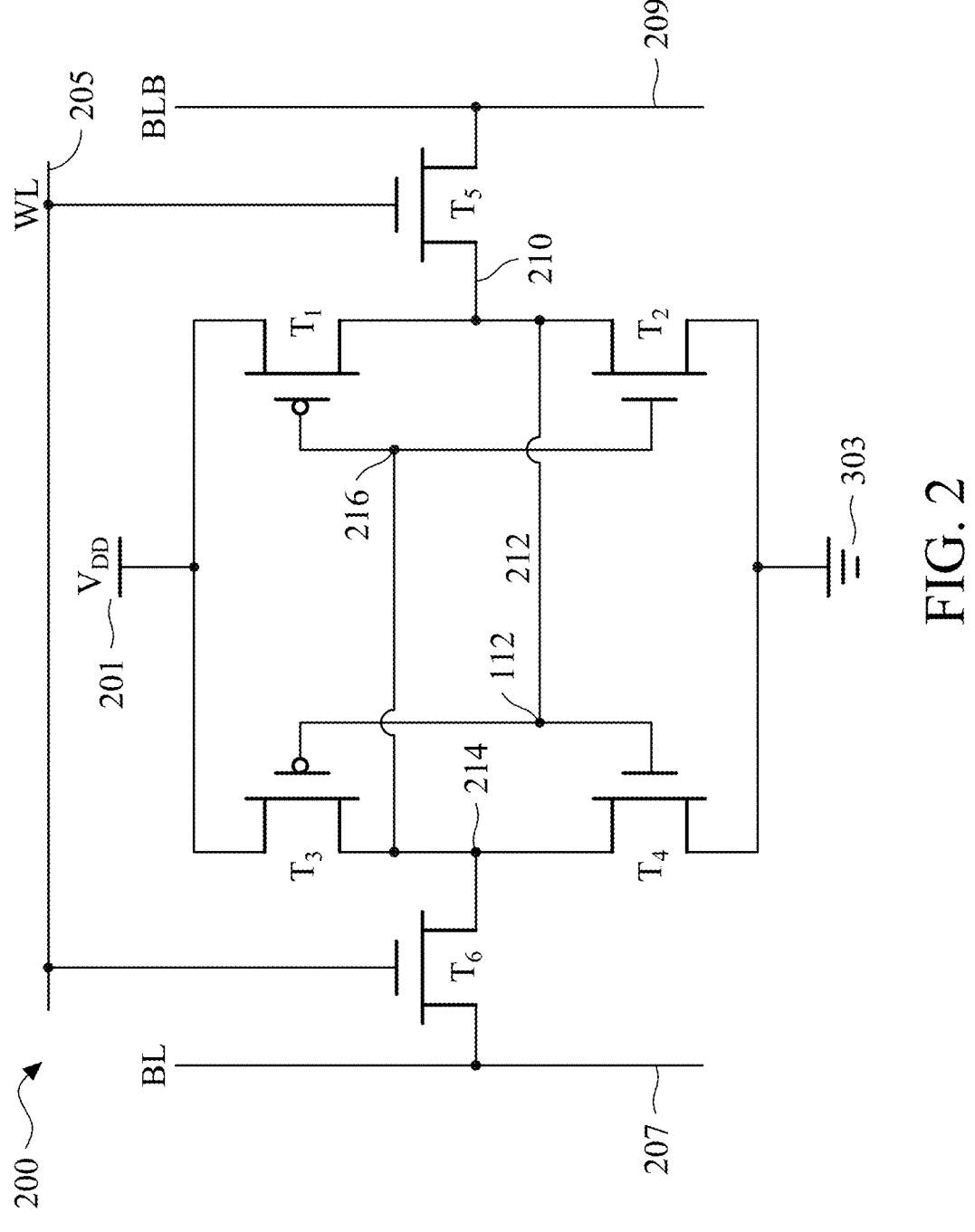
FIG. 2 is a circuit diagram illustrating an example 6T memory cell in accordance with some embodiments.

FIG. 2 is a circuit diagram illustrating an example 6T memory cell in accordance with some embodiments. Referring to FIG. 2, an example circuit diagram of a memory cell (a memory bit, or a bit cell) 200 is illustrated. In accordance with some embodiments of the present disclosure, the memory cell 200 in configured as a static random access memory (SRAM) cell that includes a number of transistors. For example in FIG. 2, the memory cell 200 includes a six-transistor (6T)-SRAM cell. Each of the transistors may be formed in a nanostructure transistor configuration, which shall be discussed in further detail below. In some other embodiments, the memory cell 200 may be implemented as any of a variety of other SRAM cells such as, for example, a two-transistor-two-resistor (2T-2R) SRAM cell, a four-transistor (4T)-SRAM cell, an eight-transistor (8T)-SRAM cell, a ten-transistor (10T)-SRAM cell, etc. Further, although the discussion of the current disclosure is directed to an SRAM cell, it is understood that other embodiments of the current disclosure can also be used in any of the memory cells such as, for example, dynamic random access (DRAM) memory cells.

As shown in FIG. 2, the memory cell 200 includes 6 transistors: T1, T2, T3, T4, T5, and T6. The transistors T1 and T2 are formed as a first inverter and the transistors T3 and T4 are formed as a second inverter, wherein the first and second inverters are cross-coupled to each other. Specifically, the first and second inverters are each coupled between first voltage reference 201 and second voltage reference 203. In some embodiments, the first voltage reference 201 is a voltage level of a supply voltage applied to the memory cell 200, which is typically referred to as "Vdd." The second voltage reference 203 is typically referred to as "ground."

The first inverter (formed by the transistors T1 and T2) is coupled to the transistor T5, and the second inverter (formed by the transistors T3 and T4) is coupled to the transistor T6. In addition to being coupled to the first and second inverters, the transistors T6 and T5 are each coupled to a word line (WL) 205 and are coupled to a bit line (BL) 207 and a complementary bit line 209 (sometimes referred to as bit line bar or BLB), respectively.

Figure 3:
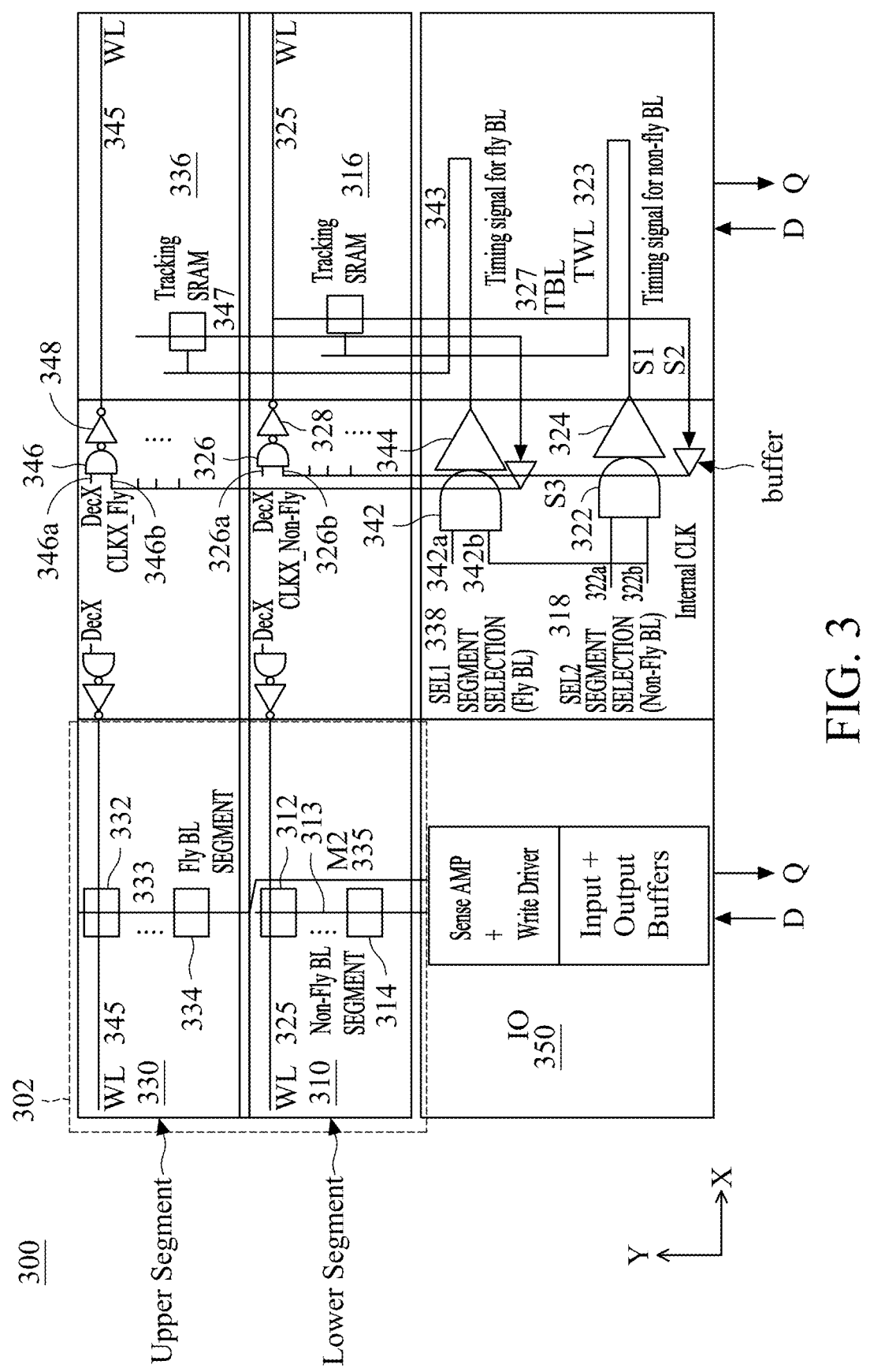
FIG. 3 illustrates an example schematic diagram for a memory circuit in accordance with some embodiments.

In some embodiments, the transistors T1 and T3 are referred to as pull-up transistors of the memory cell 200 (hereinafter "pull-up transistor T1" and "pull-up transistor T3," respectively); the transistors T2 and T4 are referred to as pull-down transistors of the memory cell 200 (hereinafter "pull-down transistor T2" and "pull-down transistor T4," respectively); and the transistors T5 and T6 are referred to as access transistors of the memory cell 200 (hereinafter "access transistor T5" and "access transistor T6," respectively). In some embodiments, the transistors T2, T4, T5, and T6 each includes an n-type metal-oxide-semiconductor (NMOS) transistor, and T1 and T3 each includes a p-type metal-oxide-semiconductor (PMOS) transistor. Although the illustrated embodiment of FIG. 3 shows that the transistors T1-T6 are either NMOS or PMOS transistors, any of a variety of transistors or devices that are suitable for use in a memory device may be implemented as at least one of the transistors T1-T6 such as, for example, a bipolar junction transistor (BJT), a high-electron-mobility transistor (HEMT), etc.

The access transistors T5 and T6 each has a gate coupled to the WL 205. The gates of the transistors T5 and T6 are configured to receive a pulse signal, through the WL 205, to allow or block an access of the memory cell 200 accordingly, which will be discussed in further detail below. The transistors T2 and T5 are coupled to each other at node 210 with the transistor T2's drain and the transistor T5's source. The node 210 is further coupled to a drain of the transistor T1 and node 212. The transistors T4 and T6 are coupled to each other at node 214 with the transistor T4's drain and the transistor T6's source. The node 214 is further coupled to a drain of the transistor T3 and node 216.

When a memory cell (e.g., the memory cell 200) stores a data bit, a first node of the bit cell is configured to be at a first logical state (either a logical 1 or a logical 0), and a second node of the bit cell is configured to be at a second logical state (either a logical 0 or a logical 1). The first and second logical states are complementary with each other. In some embodiments, the first logical state at the first node may represent the logical state of the data bit stored in the memory cell. For example, in the illustrated embodiment of FIG. 2, when the memory cell 200 store a data bit at a logical 1 state, the node 210 is configured to be at the logical 1 state, and the node 214 is configured to be at the logical 0 state.

To read the logical state of the data bit stored in the memory cell 200, the BL 207 and BLB 209 are pre-charged to Vdd (e.g., a logical high, e.g., using a capacitor to hold the charge). Then the WL 205 is asserted, or activated, by an assert signal to a logical high, which turns on the access transistors T5 and T6. Specifically, a rising edge of the assert signal is received at the gates of the access transistors T5 and T6, respectively, so as to turn on the access transistors T5 and T6. Once the access transistors T5 and T6 are turned on, based on the logical state of the data bit, the pre-charged BL 207 or BLB 209 may start to be discharged. For example, when the memory cell 200 stores a logical 0, the node 214 (e.g., Q) may present a voltage corresponding to the logical 1, and the node 210 (e.g., Q bar) may present a voltage corresponding to the complementary logical 0. In response to the access transistors T5 and T6 being turned on, a discharge path, starting from the pre-charged BLB 209, through the access transistor T5 and pull-down transistor T2, and to ground 203, may be provided. While the voltage level on the BLB 209 is pulled down by such a discharge path, the pull-down transistor T4 may remain turned off. As such, the BL 207 and the BLB 209 may respectively present a voltage level to produce a large enough voltage difference between the BL 207 and BLB 209. Accordingly, a sensing amplifier, coupled to the BL 207 and BLB 209, can use a polarity of the voltage difference to determine whether the logical state of the data bit is a logical 1 or a logical 0.

To write the logical state of the data bit stored in the memory cell 200, the data to be written is applied to the BL 207 and/or the BLB 209. For example, BLB 209 is tied/ shorted to 0V, e.g., ground 203, with a low-impedance connection. Then, the WL 205 is asserted, or activated, by an assert signal to a logical high, which turns on the access transistors T5 and T6. Once the access transistors T5 and T6 are turned on, based on the logical state of BLB 209, the node 210 may start to be discharged. For example, before T5 and T6 are turned on, the BLB 209 may present a voltage corresponding to the logical 0, and the node 210 may present a voltage corresponding to the complementary logical 1. In response to the access transistors T5 and T6 being turned on, a discharge path, starting from the node 210, through the access transistor T5 to ground 203, may be provided. Once the voltage level on the node 210 is pulled down below the Vth (threshold voltage) of the pull-down transistor T4, T4 may turn off and T3 may turn on, causing node 214 to be pulled up to Vdd 201. Once node 214 is less than a Vth from Vdd 201, T1 may turn off and T2 may turn off, causing node 210 to be pulled down to ground 203. Then, when the WL 205 is de-asserted, the logical state applied to the BL 207 and/or the BLB 209 has been stored in the memory cell 200.

FIG. 3 illustrates an example schematic diagram for a memory circuit 300 (e.g., a memory array (e.g., 10 in FIG. 1) configured in a SRAM architecture), in accordance with some embodiments. Specifically, FIG. 3 illustrate an example schematic diagram 300 for a dual tracking fly bit line (BL) static random access memory (SRAM) architecture in accordance with some embodiments. As a brief overview, the memory circuit 300 may comprise a memory array 302, a first tracking cell 316, a second tracking cell 336, a first tracking circuit 318, and a second tracking circuit 338. Despite not being shown in FIG. 3, all of the components of the memory circuit 300 may be coupled to each other and to a control logic circuit to receive control signals (e.g., D, Q, CLK, CEB, WEB signals). Although, in the illustrated embodiment of FIG. 3, each component is shown as a separate block for the purpose of clear illustration, in some other embodiments, some or all of the components shown in FIG. 3 may be integrated together. For example, the memory array 302 may include an embedded I/O circuit (e.g., 350). The memory circuit 300 of FIG. 3 is simplified for illustrative purposes, and thus, it should be understood that some components of FIGS. 1 and 2 may be omitted in FIG. 3.

In some embodiments, the memory array 302 may comprise a plurality of non-volatile memory cells 312, 314, 332, 334. The non-volatile memory cells can retain stored data in the absence of power, whereas the volatile memory device loses its data memory contents when power is lost. The non-volatile memory cells can include any of various non-volatile memory cells such as, for example, static random access memory (SRAM) cells, resistive random access memory (RRAM) cells, spin-transfer torque random-access memory (STT-RAM) cells, ferroelectric random-access memory (FeRAM) cells, magnetoresistive random-access memory (MRAM) cells, phase-change random-access memory (PCRAM) cells, etc., while remaining within the scope of the present disclosure. In some embodiments, the non-volatile memory cell can be configured to be programmed from a first state to a second state.

In some embodiments, a first portion 310 (e.g., lower segment, non-fly BL segment) of the memory array 302 may comprise a plurality of first nominal memory cells 312, 314. The plurality of first nominal memory cells 312, 314 can be coupled to a first bit line segment 313 extending along a first lateral direction (e.g., Y-direction).

In some embodiments, a second portion 330 (e.g., upper segment, fly BL segment) of the memory array 302 may comprise a plurality of second nominal memory cells 332, 334. The plurality of second nominal memory cells 332, 334 can be coupled to a second bit line segment 333 and a third bit line segment 335 both extending along the first lateral direction (e.g., Y-direction). The third bit line segment 335 can be vertically disposed above the first bit line segment 313.

In some embodiments, the first bit line segment 313 and the second bit line segment 333 can be disposed in a first metallization layer (e.g., M0, or M1). In certain embodiments, the third bit line segment 335 can be disposed in a same metallization layer (e.g., M0, or M1). In some embodiments, the third bit line segment 335 can be disposed in a different metallization layer (e.g., a second metallization layer, M2) above the first metallization layer. In various embodiments, a fly shared bit lines structure can be configured in the memory circuit 300. The term "fly shared bit lines" may be referred to at least two pairs of bit lines have segmented connections to corresponding components (e.g., memory cells) at respectively different locations (e.g., a lower segment and an upper segment). For example, the first bit line segment 313 may, along a first lateral direction (e.g., Y), physically extend across a first portion 310 of a substrate where the plurality of first nominal memory cells 312, 314 are formed from a memory I/O (MIO) device 350. The second bit line segment 333 may, along a first lateral direction (e.g., Y), physically extend across the second portion 330 where the plurality of second nominal memory cells 332, 334 are formed from the first portion 310. The third bit line segment 335 may, along a first lateral direction (e.g., Y), physically extend across the first portion 310 from a memory I/O device 350. The third bit line segment 335 can be vertically disposed above the first bit line segment 313.

In some embodiments, the first tracking cell 316 can be disposed next to the first portion 310 of the memory array 302 along a second lateral direction (e.g., X-direction) perpendicular to the first lateral direction (e.g., Y-direction). The first tracking cell 316 can be a component or subsystem within an electronic system that is responsible for monitoring and maintaining specific parameters or signals within desired ranges. In the context of memory architectures such as SRAM, the first tracking cell 316 can be used to ensure that timing signals, voltages, or currents associated with different segments or components of the memory operate within specified limits.

In some embodiments, the second tracking cell 336 can be disposed next to the second portion 330 of the memory array 302 along the second lateral direction (e.g., X-direction). The second tracking cell 336 can be a component or subsystem within an electronic system that is responsible for monitoring and maintaining specific parameters or signals within desired ranges. In the context of memory architectures such as SRAM, the second tracking cell 336 can be used to ensure that timing signals, voltages, or currents associated with different segments or components of the memory operate within specified limits.

In some embodiments, the first tracking circuit 318 can be configured to activate the first tracking cell 316, in response to at least one of the first nominal memory cells 312, 314 being selected. The first tracking circuit 318 may comprise at least one of: a first AND gate 322, a first tracking word line 323 coupled to a gate terminal of the first tracking cell 316, or a first buffer 324. The first AND gate 322 may have a first input terminal 322*b* configured to receive a clock signal (e.g., internal CLK), and a second input terminal 322*a* configured to receive a first control signal (e.g., SLE2) asserted to a first logic state (e.g., "1") when the at least one first nominal memory cell 312, 314 is selected. The first AND gate 322 can be configured to assert the first tracking word line 323 to the first logic state (e.g., "1") when the at least one first nominal memory cell 312, 314 is selected. In some embodiments, the first tracking circuit 318 can be configured to provide a timing signal for non-fly BL.

In some embodiments, the first tracking circuit 318 may further comprise at least one of: a first NAND gate 326 and a first inverter 328 coupled to a first word line 325 coupled to the at least one first nominal memory cell 312. The first NAND gate 326 may have a first input terminal 326*a* configured to receive a first address signal (e.g., DecX) asserted to the first logic state when the at least one first nominal memory cell 312 is selected, and a second input terminal 326*b* configured to receive a first signal (e.g., CLKX_Non-Fly) present on a first tracking bit line 327 coupled to the first tracking cell 316. If the fly BL segment is selected, all of S1, S2, and S3 signals can be set to "0."

In some embodiments, the second tracking circuit 338 can be configured to activate the second tracking cell 336, in response to at least one of the second nominal memory cells 332, 334 being selected. The second tracking circuit 338 may comprise at least one of: a second AND gate 342, a second tracking word line 343 coupled to a gate terminal of the second tracking cell 336, or a second buffer 344. The second AND gate 342 may have a first input terminal 342*b* configured to receive the clock signal (e.g., internal CLK), and a second input terminal 342*a* configured to receive a second control signal (e.g., SEL1) asserted to the first logic state (e.g., "1") when the at least one second nominal memory cell 332, 334 is selected. The second AND gate 342 can be configured to assert the second tracking word line 343 to the first logic state (e.g., "1") when the at least one second nominal memory cell 332, 334 is selected. In some embodiments, the second tracking circuit 338 can be configured to provide a timing signal for fly BL.

In some embodiments, the second tracking circuit 338 may comprise at least one of: a second NAND gate 346 and a second inverter 348 coupled to a second word line 345 coupled to the at least one second nominal memory cell 332. The second NAND gate 346 may have a first input terminal 346*a* configured to receive a second address signal (e.g., DecX) asserted to the first logic state when the at least one second nominal memory cell 332 is selected, and a second input terminal 346*b* configured to receive a second signal (e.g., CLKX_Fly) present on a second tracking bit line 347 coupled to the second tracking cell 336. In some embodiments, DecX can be respective row enable signal generated by a row decoder. Internal CLK (ICLK) can be generated by a clock generator of a global control circuit based on a input clock (CLK). In some embodiments, a routing path of Non Fly-BL can be shorter than that of Fly-BL. In some embodiments, the WL 345 in upper segment 330 and the WL 325 in lower segment 310 may use different timing signals, such as CLKX_Fly and CLKX_Non-Fly. In some embodiments, a first signal present on the first word line has a first pulse width when the at least one first nominal memory cell is selected. A second signal present on the second word line has a second pulse width when the at least one second nominal memory cell is selected. The first pulse width is narrower than the second pulse width.

In some embodiments, the memory circuit 300 may include a memory I/O (MIO) device 350. The memory I/O device may include a sense amplifier, a write driver, an input buffer, and an output buffer. The memory I/O device may encompass several key components essential for data transfer and communication within a computer system. These components may include a sense amplifier, which is responsible for detecting and amplifying the weak signals from memory cells during read operations, ensuring accurate data retrieval. Additionally, a write driver is employed to send data from the memory system to external devices or storage media, facilitating write operations efficiently. Furthermore, input and output buffers can manage data flow between the memory system and external devices, ensuring seamless communication and data transfer. Overall, these components collectively form the memory I/O device, enabling the efficient exchange of data between the memory circuit 300.

By incorporating different timing signals (e.g., SEL1 and SEL2) for the fly BL in the upper segment 330 and non-fly BL in the lower segment 310 of the SRAM, alongside separate read tracking and write tracking paths for each segment, several advantages emerge.

Figure 4:
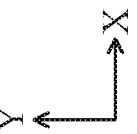
FIG. 4 is a block diagram illustrating an example fly bit line structure in accordance with some embodiments.

FIG. 4 is a block diagram illustrating an example fly bit line structure 400 of a portion of the memory circuit 300 shown in FIG. 3, in accordance with some embodiments. In the fly bit line (BL) static random access memory (SRAM) architecture 400, the fly BL 333, 335 (e.g., BL-N at M2) in the upper segment 330 is designed to fly over the BL 313 (e.g., BL-N at M0) in the lower segment 310. The BL 313 may include a first bit line segment 313. The fly BL may include a second bit line segment 333 and a third bit line segment 335 both extending along the first lateral direction (e.g., Y-direction). The third bit line segment 335 can be vertically disposed above the first bit line segment 313. All the segments 313, 333, 315 can be connected to the same memory I/O device 350, facilitating efficient data transfer and communication within the memory system. This design allows for a compact layout while ensuring that the fly BL and non-fly BL segments operate effectively, contributing to the overall performance and functionality of the SRAM memory architecture.

In some embodiments, a first tracking cell 316 can be disposed next to the first portion 310 of the memory array 302 along a second lateral direction (e.g., X-direction) perpendicular to the first lateral direction (e.g., Y-direction). A second tracking cell 336 can be disposed next to the second portion 330 of the memory array 302 along the second lateral direction (e.g., X-direction). The separate tracking cells 316, 336 can be components or subsystems within the memory circuit 300 that are responsible for monitoring and maintaining specific parameters or signals within desired ranges. In some embodiments, implementing separate timing circuits for the fly BL 330 and non-fly BL 310 segments allow for precise timing of each segment, eliminating over-margining in the non-fly BL segments. This optimization leads to lower power consumption in the non-fly BL segment, reducing the average power by approximately about 20%. This power-saving benefit is observed for a 512 Kb instance (e.g., 0.5 Mb), where typically, such an instance consumes about 8 uA/MHz of active power. It is worth noting that smaller instances can experience proportionally smaller savings in power consumption.

Figure 5:
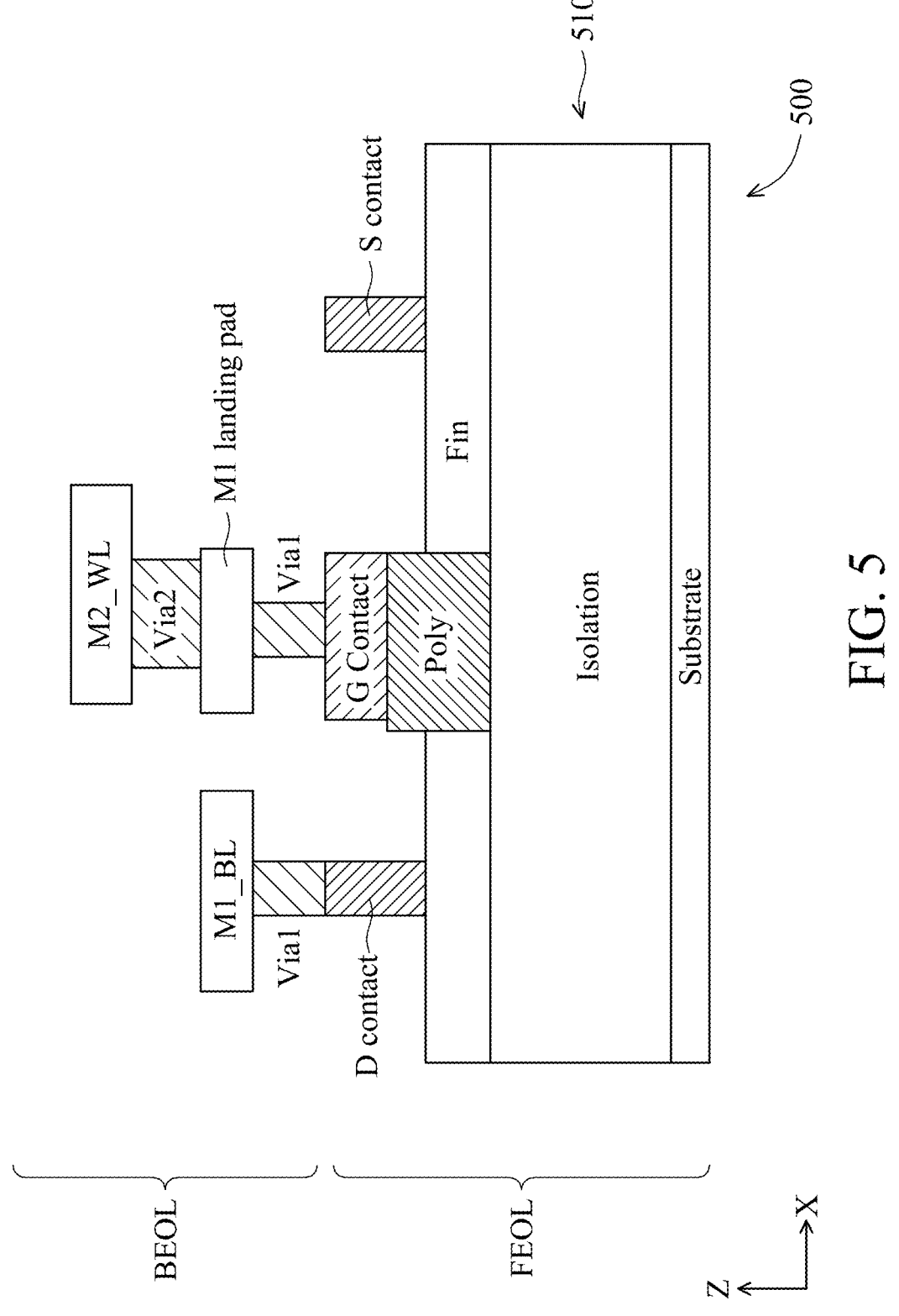
FIG. 5 is a block diagram illustrating a cross-section of an example semiconductor structure in accordance with some embodiments.

To further illustrate relative (e.g., vertical) arrangement of these structures in FIGS. 3 and 4, FIG. 5 depicts a cross-section of an example semiconductor structure 500 (e.g., memory cell 312 in FIG. 3) in accordance with some embodiments. The embodiment shown includes a FEOL layer including semiconductor structures and a BEOL layer including interconnect metal layer structures.

In the embodiment shown, the FEOL layer illustrates a pass gate FinFET transistor 510. The pass gate FinFET transistor 510 includes a semiconductor substrate, a fin, an isolation region, a polysilicon structure, e.g. poly, the conductive contacts S and D connected to the fin, and the conductive G contact connected to the polysilicon structure. In the embodiment shown, the conduction path for current is the fin (the fin can also be referred to as the diffusion region or oxide diffusion region). The polysilicon structure functions as a gate allowing current flow in the fin from the S (e.g. source) contact to the D (e.g. drain) contact. For example, for a voltage potential between the S and D contacts, current can flow in the fin from S to D depending on a voltage applied to the polysilicon structure. If a voltage less than a threshold voltage is applied to the poly, then appreciable current cannot flow in the fin from the S to the D contacts, and the transistor 510 is "off." If a voltage greater than or equal to the threshold voltage is applied to the poly, appreciable current flows from S to D via the fin and the transistor 510 is "on." In some embodiments, the S, D, and G contacts form connections between multiple fins and polysilicon structures in the FEOL layer, thereby connecting the sources, drains, and gates of one or more transistors. In some embodiments, the sources, drains, and gates of the transistor 510 are connected to an interconnect metal layer structure in the BEOL layer. For example, typically the gates of the transistor 510 is connected to a word line, the word line being one of the metal bars in one of the layers of the interconnect metal structure in the BEOL layer, and the S/D contacts of pass gate transistors 510 can similarly be connected to the complementary bit lines BL and BLB, the complementary bit lines BL and BLB being other ones of the metal bars in one or more of the metal layers in the BEOL layer. In some embodiments, the BEOL layer serves to connect the transistor 510 to peripheral circuits, for example for read/write operations. In the embodiment shown, the D, and G contacts connect to the metal bars in the BEOL layer using vias. For example, Via1 forms a connection between the D contact to a metal bar, e.g. a bit line, in the first metal layer M1 above the FEOL layer. In the embodiment shown, a separate Via1 connects the G contact to a conductive landing pad in the M1 layer, and Via2 connects the conductive landing pad to a metal bar, e.g. the word line, in the M2 layer. In some embodiments, the conductive landing pad in the M1 layer can be formed from a metal bar that has been cut, or disconnected, in the plane of its metal layer.

Figure 6:
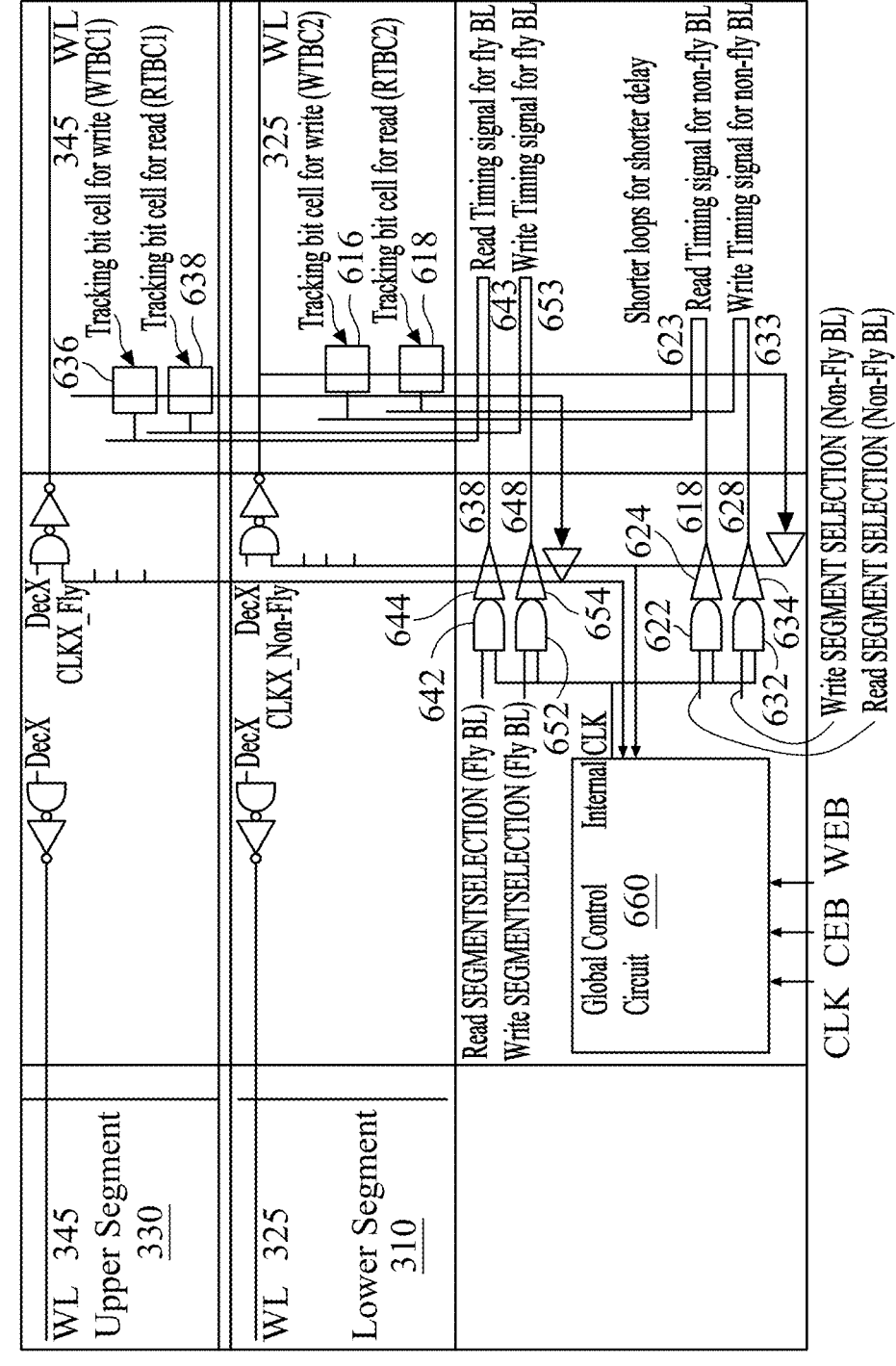
FIG. 6 illustrates an example schematic diagram for a memory circuit in accordance with some embodiments.

FIG. 6 illustrates an example schematic diagram for a memory circuit 600 in accordance with some embodiments. FIG. 6 illustrates an alternative example of FIG. 3 by introducing tracking bit cells for write 616, 636 and tracking bit cells for read 626, 646. The memory circuit 600 may include a memory array, a first tracking cell 616, a second tracking cell 636, a third tracking cell 626, a fourth tracking cell 646, a first tracking circuit 618, a second tracking circuit 638, a third tracking circuit 628, and a fourth tracking circuit 648. The memory circuit 600 of FIG. 6 is substantially similar to the memory circuit 300 of FIG. 3, except for the additional tracking cells 616, 618, 636, 638 and the additional tracking circuits 618, 628, 638, 648. The implementation of separate read/write tracking paths provides increased tuning flexibility, enhancing overall performance and efficiency in the SRAM architecture.

In some embodiments, the first tracking cell 616 (e.g., tracking bit cell for write (WTBC2)) can be disposed next to the first portion 310 of the memory array 302 along the second lateral direction (e.g., X-direction) perpendicular to the first lateral direction (e.g., Y-direction). The first tracking cell 616 can be a component or subsystem within the memory circuit 600 that is responsible for monitoring and maintaining specific parameters or write signals within desired ranges. In the context of memory architectures such as SRAM, the first tracking cell 616 can be used to ensure that write timing signals, voltages, or currents associated with different segments or components of the memory operate within specified limits.

In some embodiments, the second tracking cell 636 (e.g., tracking bit cell for write (WTBC1)) can be disposed next to the second portion 330 of the memory array 302 along the second lateral direction (e.g., X-direction) perpendicular to the first lateral direction (e.g., Y-direction). The second tracking cell 636 can be a component or subsystem within the memory circuit 600 that is responsible for monitoring and maintaining specific parameters or write signals within desired ranges. In the context of memory architectures such as SRAM, the second tracking cell 636 can be used to ensure that write timing signals, voltages, or currents associated with different segments or components of the memory operate within specified limits.

In some embodiments, the third tracking cell 618 (e.g., tracking bit cell for read (RTBC2)) can be disposed next to the first portion 310 of the memory array 302 along the second lateral direction (e.g., X-direction) perpendicular to the first lateral direction (e.g., Y-direction). The third tracking cell 618 can be a component or subsystem within the memory circuit 600 that is responsible for monitoring and maintaining specific parameters or read signals within desired ranges. In the context of memory architectures such as SRAM, the third tracking cell 618 can be used to ensure that read timing signals, voltages, or currents associated with different segments or components of the memory operate within specified limits.

In some embodiments, the fourth tracking cell 638 (e.g., tracking bit cell for read (RTBC1)) can be disposed next to the second portion 330 of the memory array 302 along the second lateral direction (e.g., X-direction) perpendicular to the first lateral direction (e.g., Y-direction). The fourth tracking cell 638 can be a component or subsystem within the memory circuit 600 that is responsible for monitoring and maintaining specific parameters or read signals within desired ranges. In the context of memory architectures such as SRAM, the fourth tracking cell 638 can be used to ensure that read timing signals, voltages, or currents associated with different segments or components of the memory operate within specified limits.

In some embodiments, the first tracking circuit 618 can be configured to activate the first tracking cell 616, in response to at least one of the first nominal memory cells in the lower segment 310 being selected. The first tracking circuit 618 may comprise at least one of: a first AND gate 622, a first tracking word line 623 coupled to a gate terminal of the first tracking cell 316, or a first buffer 624. The first AND gate 622 may have a first input terminal configured to receive a clock signal (e.g., internal CLK), and a second input terminal configured to receive a first control signal (e.g., read segment selection (non-fly BL)) asserted to a first logic state (e.g., "1") when the at least one first nominal memory cell in the lower segment 310 is selected. The first AND gate 622 can be configured to assert the first tracking word line 623 to the first logic state (e.g., "1") when the at least one first nominal memory cell in the lower segment 310 is selected. In some embodiments, the first tracking circuit 618 can be configured to provide a read timing signal for non-fly BL.

In some embodiments, the second tracking circuit 638 can be configured to activate the second tracking cell 636, in response to at least one of the second nominal memory cells in the upper segment 330 being selected. The second tracking circuit 638 may comprise at least one of: a second AND gate 642, a second tracking word line 643 coupled to a gate terminal of the second tracking cell 636, or a second buffer 644. The second AND gate 642 may have a first input terminal configured to receive the clock signal (e.g., internal CLK), and a second input terminal configured to receive a second control signal (e.g., read segment selection (fly BL)) asserted to the first logic state (e.g., "1") when the at least one second nominal memory cell in the upper segment 330 is selected. The second AND gate 642 can be configured to assert the second tracking word line 643 to the first logic state (e.g., "1") when the at least one second nominal memory cell in the upper segment 330 is selected. In some embodiments, the second tracking circuit 638 can be configured to provide a read timing signal for fly BL.

In some embodiments, the third tracking circuit 628 can be configured to activate the third tracking cell 618, in response to at least one of the first nominal memory cells in the lower segment 310 being selected. The third tracking circuit 628 may comprise at least one of: a third AND gate 632, a first tracking word line 633 coupled to a gate terminal of the third tracking cell 618, or a third buffer 634. The third AND gate 632 may have a first input terminal configured to receive a clock signal (e.g., internal CLK), and a second input terminal configured to receive a first control signal (e.g., write segment selection (non-fly BL)) asserted to a first logic state (e.g., "1") when the at least one first nominal memory cell in the lower segment 310 is selected. The third AND gate 632 can be configured to assert the third tracking word line 633 to the first logic state (e.g., "1") when the at least one first nominal memory cell in the lower segment 310 is selected. In some embodiments, the third tracking circuit 628 can be configured to provide a write timing signal for non-fly BL.

In some embodiments, the fourth tracking circuit 648 can be configured to activate the fourth tracking cell 638, in response to at least one of the second nominal memory cells in the upper segment 330 being selected. The fourth tracking circuit 648 may comprise at least one of: a fourth AND gate 652, a fourth tracking word line 653 coupled to a gate terminal of the fourth tracking cell 638, or a fourth buffer 654. The fourth AND gate 652 may have a first input terminal configured to receive the clock signal (e.g., internal CLK), and a second input terminal configured to receive a second control signal (e.g., write segment selection (fly BL)) asserted to the first logic state (e.g., "1") when the at least one second nominal memory cell in the upper segment 330 is selected. The fourth AND gate 652 can be configured to assert the fourth tracking word line 653 to the first logic state (e.g., "1") when the at least one second nominal memory cell in the upper segment 330 is selected. In some embodiments, the fourth tracking circuit 648 can be configured to provide a write timing signal for fly BL. In some embodiments, a first signal present on the first word line has a first pulse width when the at least one first nominal memory cell is selected. A second signal present on the second word line has a second pulse width when the at least one second nominal memory cell is selected. The first pulse width is narrower than the second pulse width.

In some embodiments, the memory circuit 600 may include a global control circuit 660. The global control circuit 660 can be configured to generate a control signal according to CLK, CEB, and/or WEB signals. The CLK may represent a clock signal, with "H" indicating a high (active) state and "L" indicating a low (inactive) state. The CEB may stand for chip enable bar, where "L" means the chip is enabled, and "H" means the chip is disabled. The WEB may represent a write enable bar, with "H" for write-disabled and "L" for write-enabled. The operation can be based on the state of the clock signal (CLK), chip enable bar (CEB), and/or write enable bar (WEB) signals. If the clock is high (active), the chip is enabled (CEB is low), and write is disabled (WEB is high), the operation can be a Read operation. If the clock is high (active), the chip is enabled (CEB is low), and write is enabled (WEB is low), the operation can be a Write operation. If the clock is low (inactive), regardless of the states of CEB and WEB, the operation can be Standby. If the clock is high (active), the chip is disabled (CEB is high), and the state of WEB doesn't matter, the operation can be Standby as well.

In operational logic of a memory system, only one of the following operations can be enabled at any given time: upper segment read, upper segment write, lower segment write, or lower segment read. This ensures that the memory functions in a controlled and sequential manner, preventing conflicting operations and maintaining data integrity. Additionally, at any given moment, only one of the operations represented by WTBC1, RTBC1, WTBC2, or RTBC2 can be activated. This design ensures efficient resource utilization and prevents concurrent access conflicts, contributing to the overall stability and reliability of the memory system.

In the memory architecture, the read and write operations in the upper segment involving the Fly BL utilize distinct timing signals tailored to the specific requirements of this segment. Simultaneously, the read and write operations in the lower segment, which involves the non-Fly BL, also employ different timing signals optimized for functionality of this segment. This approach ensures that each segment operates efficiently and independently, enhancing the overall performance and reliability of the memory system. By utilizing separate timing signals for the Fly BL and non-Fly BL segments, the memory architecture can effectively manage data access and transfer, contributing to improved functionality and reduced operational complexities.

Figure 7:
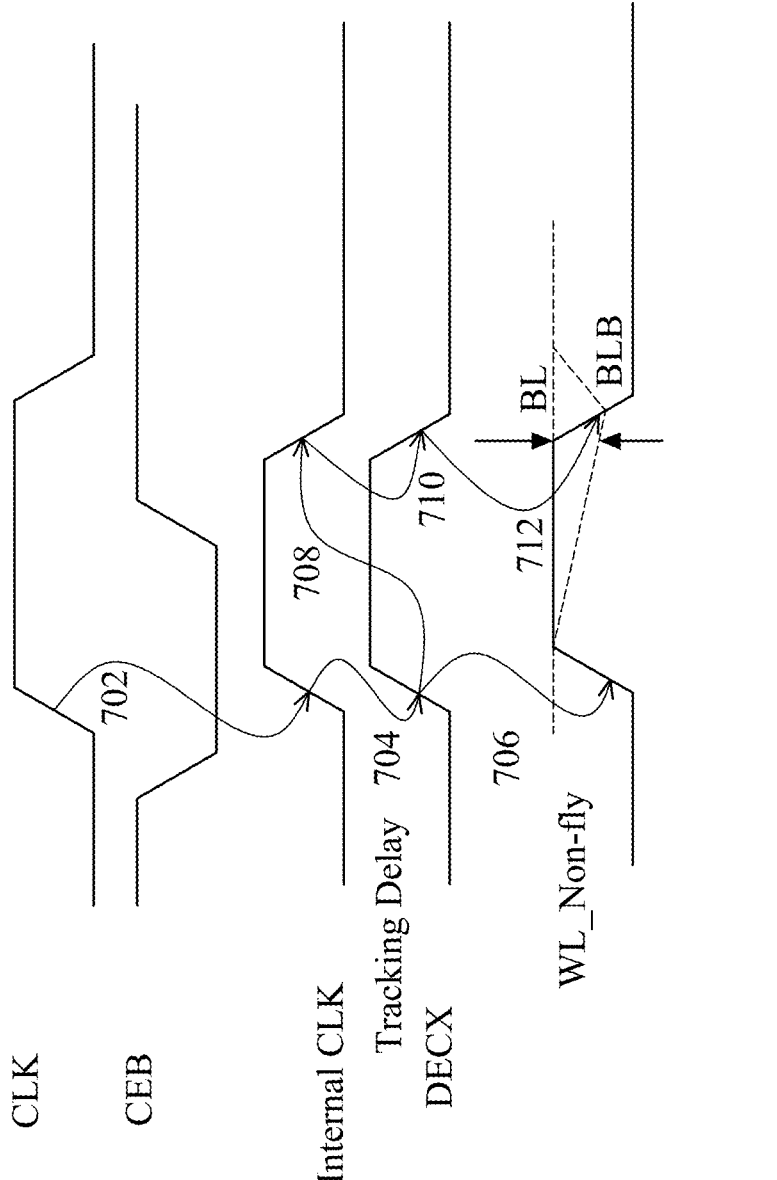
FIG. 7 illustrates example waveforms of multiple control signals to operate the memory circuit of FIG. 6 which includes a dual tracking for fly bit line static random access memory (SRAM) architecture, in accordance with some embodiments.

FIG. 7 illustrates example waveforms of multiple control signals to operate the memory circuit 600 of FIG. 6 which includes a dual tracking for fly bit line static random access memory (SRAM) architecture, in accordance with some embodiments.

The waveforms of multiple control signals begin with an activation of internal CLK (Phase 702), which goes high after the rising edge of the main CLK signal. Subsequently, CLKX and DecX are activated (Phase 704), with CLKX experiencing a tracking delay as it traverses the tracking bit cell and tracking bit line. Concurrently, DecX also goes high (Phase 704). When both DecX and CLKX are in the "1" state, indicating their activation, WL_Non-fly is asserted (Phase 706). Following this phase, internal CLK transitions from high to low (Phase 708), after a period marked by the activation of DecX. Subsequently, DecX transitions to a low state (Phase 710), leading to the de-assertion (Phase 712) of WL Non-fly. At this point, the sense amplifier engages, sensing the voltage difference between BL and BLB once the voltage difference reaches a sufficient level, completing the specified operations within the memory circuit 600.

Figure 8:
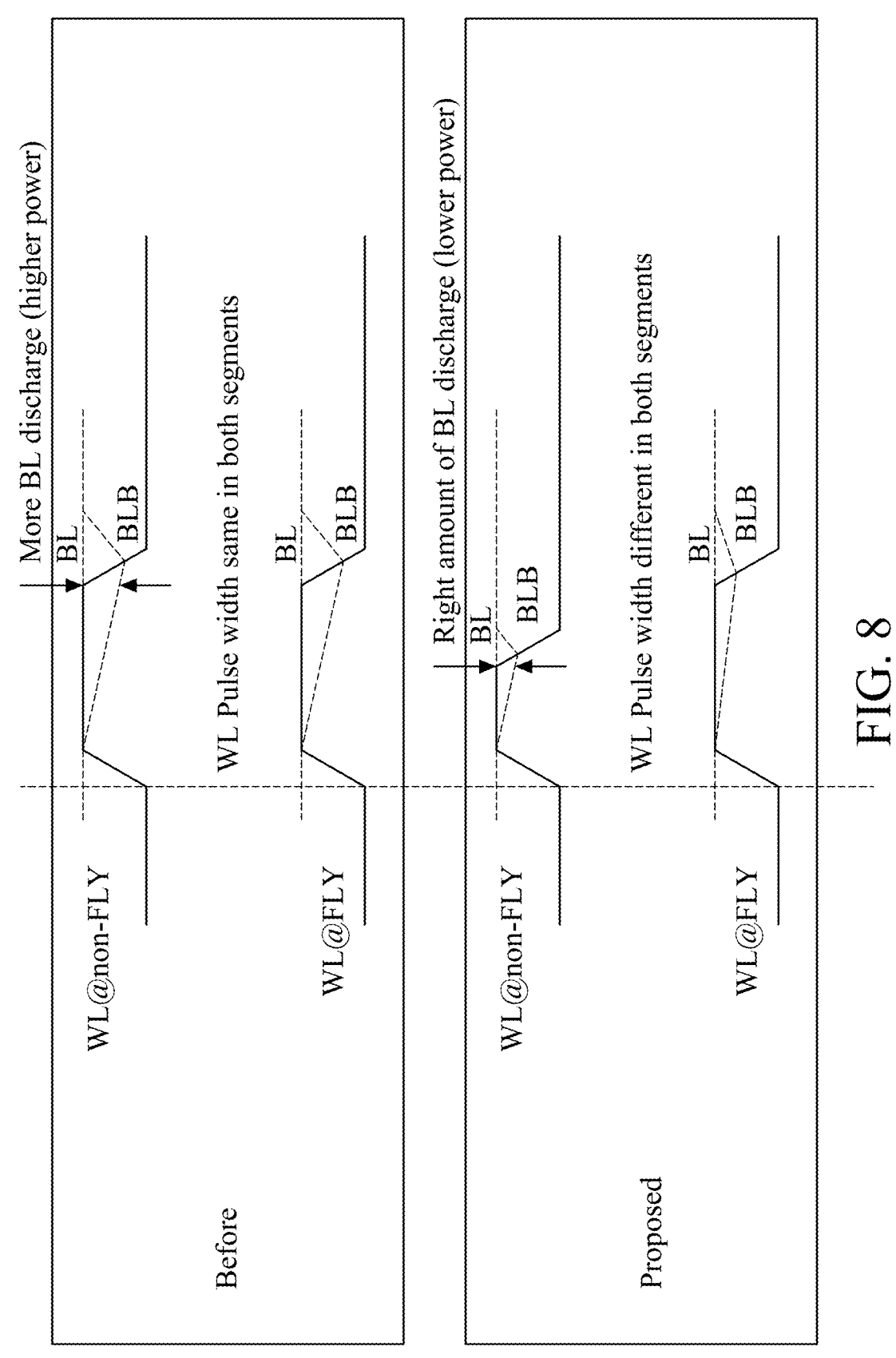
FIG. 8 illustrates an example waveform of a dual tracking for fly bit line static random access memory (SRAM) architecture, in accordance with some embodiments.

FIG. 8 illustrates an example waveform (read tracking) of a dual tracking for fly bit line static random access memory (SRAM) architecture, in accordance with some embodiments. In a waveform without implementing the dual tracking for fly bit line SRAM architecture, a pulse width of WL for non-fly segment was the same as that of WL for fly segment.

The proposed modification aims to optimize power consumption during read operations in the memory circuit 300, 600. Due to the greater capacitance of WL for non-fly segment, a pulse width of WL for non-fly segment can be shorter than a pulse width of WL for fly segment. The pulse width of WL for non-fly segment can be shorten. This adjustment is intended to reduce power consumption specifically during read operation, leveraging the capacitance difference between the two segments (fly and non-fly segments) to achieve efficiency gains. In the present disclosure, separating read and write tracking allows for enhanced tuning flexibility. Therefore, two tracking elements can be present per segment—one dedicated to read operations and another for write operations. This separation enables finer control and optimization of timing parameters, contributing to improved performance and reliability in the memory circuit 300, 600.

Figure 9:
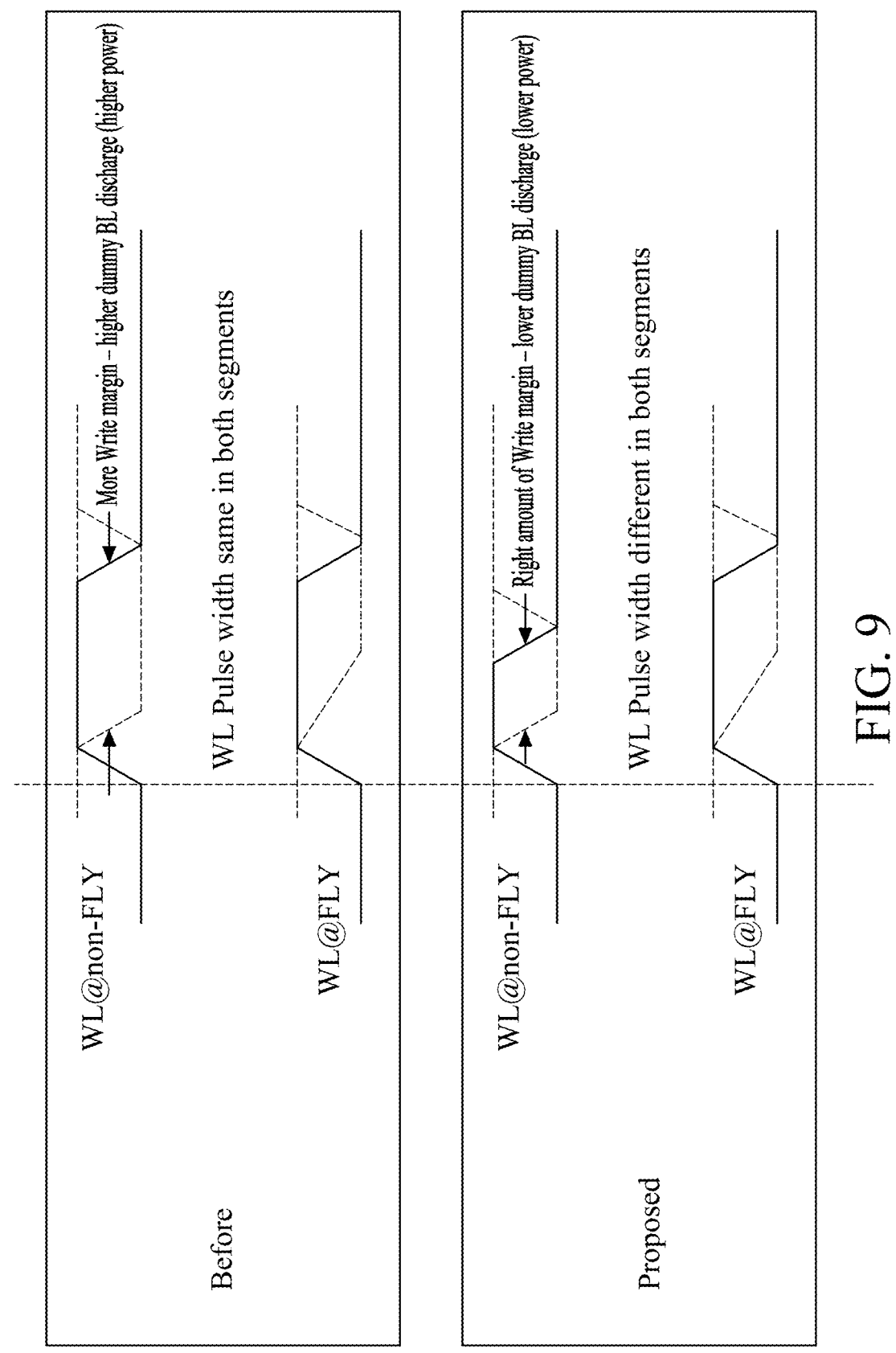
FIG. 9 illustrates an example waveform of a dual tracking for fly bit line static random access memory (SRAM) architecture, in accordance with some embodiments.

FIG. 9 illustrates an example waveform (write tracking) of a dual tracking for fly bit line static random access memory (SRAM) architecture, in accordance with some embodiments. In a waveform without implementing the dual tracking for fly bit line SRAM architecture, a pulse width (write margin) of WL for non-fly segment was the same as that of WL for fly segment.

The proposed modification aims to optimize power consumption during write operations in the memory circuit 300, 600. Due to the greater capacitance of WL for non-fly segment, a pulse width (write margin) of WL for non-fly segment can be shorter than a pulse width of WL for fly segment. The pulse width of WL for non-fly segment can be shorten. This adjustment is intended to reduce power consumption specifically during write operation, leveraging the capacitance difference between the two segments (fly and non-fly segments) to achieve efficiency gains. In the present disclosure, separating read and write tracking allows for enhanced tuning flexibility. Therefore, two tracking elements can be present per segment—one dedicated to read operations and another for write operations. This separation enables finer control and optimization of timing parameters, contributing to improved performance and reliability in the memory circuit 300, 600.

Figure 10:
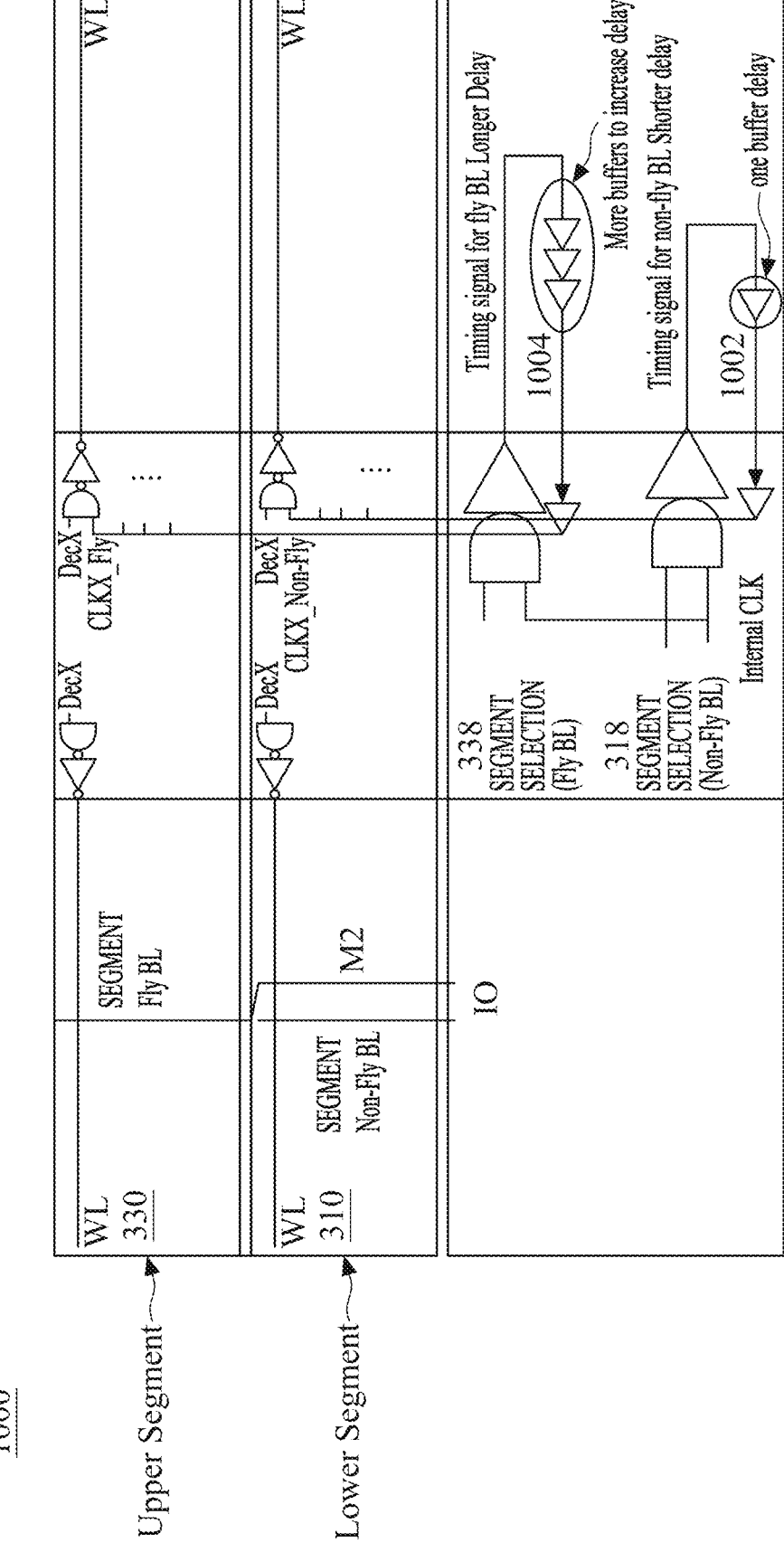
FIG. 10 illustrates an example schematic diagram for a memory circuit in accordance with some embodiments.

FIG. 10 illustrates an example schematic diagram for a memory circuit 1000 in accordance with some embodiments. FIG. 10 illustrates an alternative example of FIG. 3 by introducing delay buffers 1002, 1004. The memory circuit 1000 may include a memory array 302, a first tracking/delay circuit 318, a second tracking/delay circuit 338, a first delay buffer 1002, and a second delay buffer 1004. The memory circuit 1000 of FIG. 10 is substantially similar to the memory circuit 300 of FIG. 3, except for the delay buffers 1002, 1004. The implementation of delay buffers provides increased tuning flexibility, enhancing overall performance and efficiency in the SRAM architecture.

In certain embodiments, the memory circuit 1000 incorporates a delay buffer to fine-tune the timing signals for both the non-fly BL segment 310 and the fly BL segment 330. Given that the non-fly bit line segment 310 requires a shorter delay, the first tracking/delay circuit 318 for the non-fly BL may incorporates a smaller buffer 1002 to achieve the adjustment. Conversely, because the fly bit line segment 330 necessitates a longer delay, the second tracking/delay circuit 338 for the fly BL may incorporate a larger buffer 1004 to accommodate this requirement. This differential buffering approach ensures that the timing signals are precisely adjusted for each segment, optimizing the performance and functionality of the memory circuit. In some embodiments, the first tracking/delay circuit 318 can be configured to provide a timing signal for non-fly BL (shorter delay). The second tracking/delay circuit 338 can be configured to provide a timing signal for fly BL (longer delay).

Figure 11:
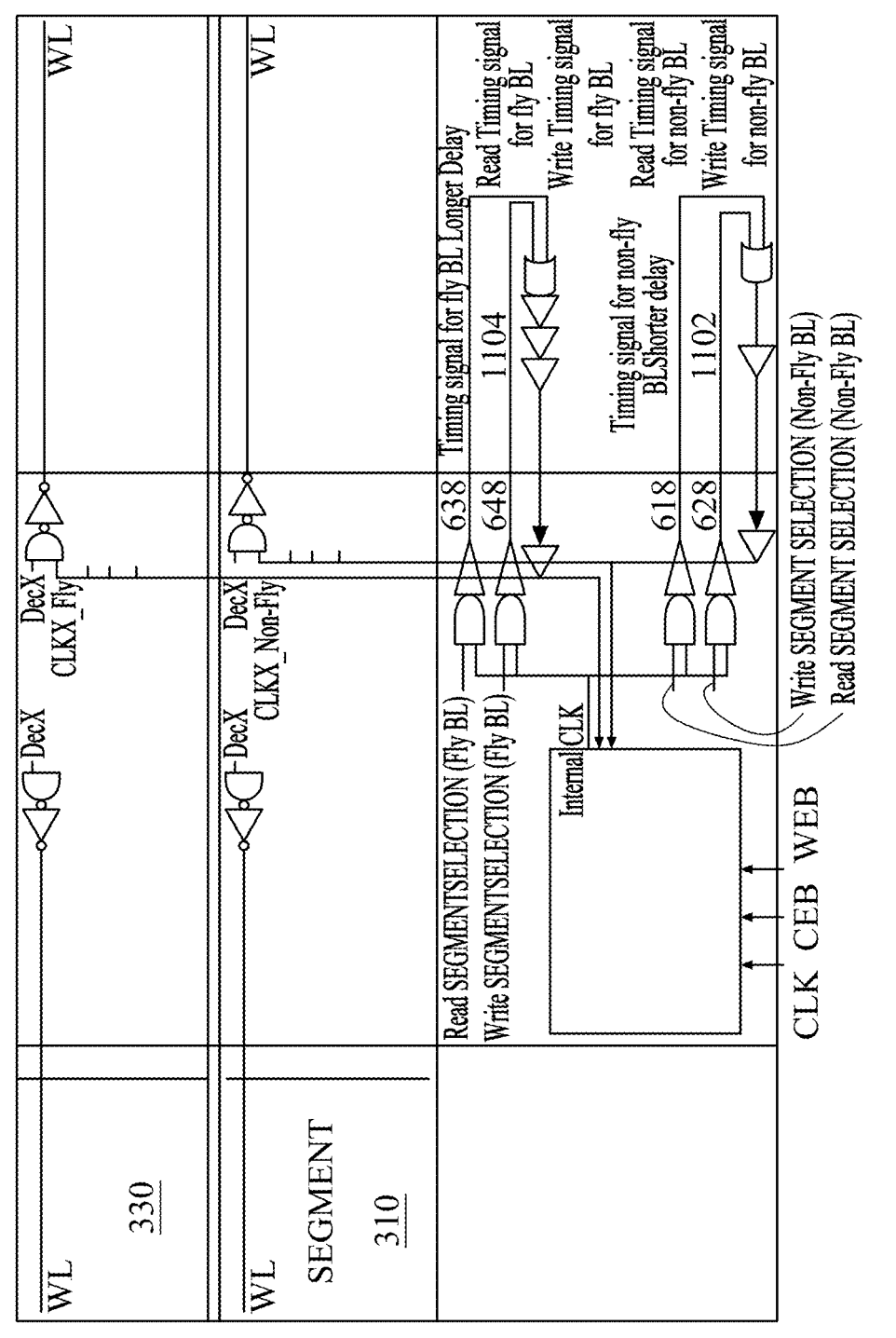
FIG. 11 illustrates an example schematic diagram for a memory circuit in accordance with some embodiments.

FIG. 11 illustrates an example schematic diagram for a memory circuit 1100 in accordance with some embodiments. FIG. 11 illustrates an alternative example of FIG. 6 by introducing delay buffers 1102, 1104. The memory circuit 1100 may include a memory array, a first tracking/delay circuit 618, a second tracking/delay circuit 638, a third tracking/delay circuit 628, a fourth tracking/delay circuit 648, a first delay buffer 1102, and a second delay buffer 1104. The memory circuit 1100 of FIG. 11 is substantially similar to the memory circuit 600 of FIG. 6, except for the delay buffers 1102, 1104. The implementation of delay buffers provides increased tuning flexibility, enhancing overall performance and efficiency in the SRAM architecture.

In certain embodiments, the memory circuit 1100 incorporates a delay buffer to fine-tune the timing signals for both the non-fly BL segment 310 and the fly BL segment 330. Given that the non-fly bit line segment 310 requires a shorter delay, the first tracking/delay circuit 618 and the third tracking/delay circuit 628 for the non-fly BL may incorporates a smaller buffer 1102 to achieve the adjustment. Conversely, because the fly bit line segment 330 necessitates a longer delay, the second tracking/delay circuit 638 and the fourth tracking/delay circuit 648 for the fly BL may incorporate a larger buffer 1104 to accommodate this requirement. This differential buffering approach ensures that the timing signals are precisely adjusted for each segment, optimizing the performance and functionality of the memory circuit. In some embodiments, the first tracking/delay circuit 618 can be configured to provide a read timing signal for non-fly BL (shorter delay). The third tracking/delay circuit 628 can be configured to provide a write timing signal for non-fly BL (shorter delay). The second tracking/delay circuit 638 can be configured to provide a read timing signal for fly BL (longer delay). The fourth tracking/delay circuit 648 can be configured to provide a write timing signal for fly BL (longer delay).

In the memory circuit, the read and write operations in the upper segment, specifically involving the Fly BL, can be governed by distinct timing signals tailored to the unique requirements of the segment. Similarly, the read and write operations in the lower segment, which pertains to the non-Fly BL, also utilize different timing signals optimized for the characteristics of this segment. This approach ensures that each segment operates efficiently and independently, preventing interference and optimizing data access and transfer within the memory system. By employing separate timing signals for the fly BL and non-fly BL segments, the memory architecture can effectively manage read and write operations, enhancing overall performance and reliability.

FIG. 12 is an example method of forming a memory circuit for dual tracking for fly bit line static random access memory (SRAM) architecture in accordance with some embodiments. In overview, the method 1200 may include making a memory circuit for dual tracking a fly bit line static random access memory (SRAM) architecture.

Referring to (1202), and in some embodiments, a first portion 310 (e.g., lower segment, non-fly BL segment) of a memory array can be formed in a first area of a substrate. The first portion 310 of the memory array may include a plurality of first nominal cells 312, 314. The first portion 310 (e.g., lower segment, non-fly BL segment) of the memory array 302 may comprise a plurality of first nominal memory cells 312, 314.

Referring to (1204), and in some embodiments, a second portion 330 (e.g., upper segment, fly BL segment) of the memory array can be formed in a second area of the substrate. The second portion 330 of the memory array may include a plurality of second nominal cells 312, 314 and the second area is located next to the first area along a first lateral direction (e.g., Y-direction).

Referring to (1206), and in some embodiments, a first tracking circuit 318 configured to activate a first tracking cell 316 that mimics at least one of the first nominal cells 312, 314 can be formed. The first tracking circuit 318 may comprise at least one of: a first AND gate 322, a first tracking word line 323 coupled to a gate terminal of the first tracking cell 316, or a first buffer 324. The first AND gate 322 may have a first input terminal 322b configured to receive a clock signal (e.g., internal CLK), and a second input terminal 322a configured to receive a first control signal (e.g., SLE2) asserted to a first logic state (e.g., "1") when the at least one first nominal memory cell 312, 314 is selected. The first AND gate 322 can be configured to assert the first tracking word line 323 to the first logic state (e.g., "1") when the at least one first nominal memory cell 312, 314 is selected. In some embodiments, the first tracking circuit 318 can be configured to provide a timing signal for non-fly BL.

Referring to (1208), and in some embodiments, a second tracking circuit 338 configured to activate a second tracking cell 336 that mimics at least one of the second nominal cells 332, 334 can be formed. The second tracking circuit 338 may comprise at least one of: a second AND gate 342, a second tracking word line 343 coupled to a gate terminal of the second tracking cell 336, or a second buffer 344. The second AND gate 342 may have a first input terminal 342b configured to receive the clock signal (e.g., internal CLK), and a second input terminal 342a configured to receive a second control signal (e.g., SEL1) asserted to the first logic state (e.g., "1") when the at least one second nominal memory cell 332, 334 is selected. The second AND gate 342 can be configured to assert the second tracking word line 343 to the first logic state (e.g., "1") when the at least one second nominal memory cell 332, 334 is selected. In some embodiments, the second tracking circuit 338 can be configured to provide a timing signal for fly BL.

Referring to (1210), and in some embodiments, a first bit line 310 operatively coupled to the first nominal cells 312, 314 can be formed. The first bit line 310 may comprise a first bit line segment 313 extending along the first lateral direction (e.g., Y-direction). The plurality of first nominal memory cells 312, 314 can be coupled to a first bit line segment 313 extending along a first lateral direction (e.g., Y-direction).

Referring to (1212), and in some embodiments, a second bit line operatively coupled to the second nominal cells 332, 334 can be formed. The second bit line may comprise a second bit line segment 333 and a third bit line segment 335 both extending along the first lateral direction, and the third bit line segment is disposed above the first bit line segment. The plurality of second nominal memory cells 312, 314 can be coupled to a second bit line segment 333 and a third bit line segment 335 both extending along the first lateral direction (e.g., Y-direction). The third bit line segment 335 can be vertically disposed above the first bit line segment 313. In some embodiments, the first bit line segment 313 and the second bit line segment 333 can be disposed in a first metallization layer (e.g., M0, or M1). In certain embodiments, the third bit line segment 335 can be disposed in a same metallization layer (e.g., M0, or M1). In some embodiments, the third bit line segment 335 can be disposed in a different metallization layer (e.g., a second metallization layer, M2) above the first metallization layer.

In some embodiments, the first tracking cell 316 can be disposed in the first area next to the first portion 310 of the memory array along a second lateral direction (e.g., X-direction) perpendicular to the first lateral direction (e.g., Y-direction). The second tracking cell 316 can be disposed in the second area next to the second portion 330 of the memory array along the second lateral direction (e.g., X-direction). In some embodiments, the first tracking circuit 318 and the second tracking circuit 338 can be formed in a third area of the substrate. The first area can be interposed between the second area and the third area along the first lateral direction.

Figure 13:
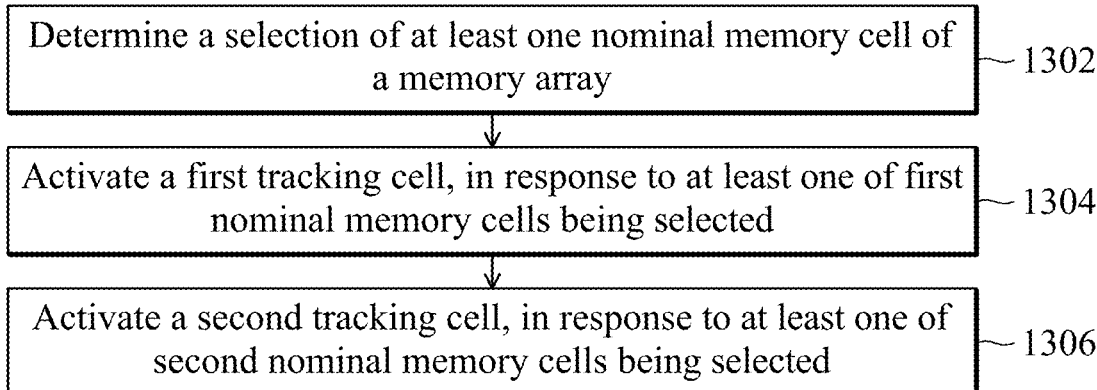
FIG. 13 is an example method of operating a memory circuit for dual tracking for fly bit line static random access memory (SRAM) architecture in accordance with some embodiments.

FIG. 13 is an example method of operating a memory circuit for dual tracking for fly bit line static random access memory (SRAM) architecture in accordance with some embodiments. It is noted that the method 1300 is merely an example, and is not intended to limit the present disclosure. Accordingly, it is understood that any additional operations may be provided during, before, and after the method 1300 of FIG. 13, and that some other operations may only be briefly described herein. The method 1300 may be utilized to operate the memory circuit 300, and thus, operations of the method 1300 will be discussed in conjunction with the components discussed in FIGS. 1-12.

In brief overview, the method 1300 starts with operation 1302 of determining a selection of at least one nominal memory cell of a memory array 302. In some embodiments, the memory circuit 300 may determine a selection of at least one nominal memory cell of a memory array 302. The memory array 302 may comprise a first portion 310 and a second portion 330. The first portion 310 may comprise a plurality of first nominal memory cells 312, 314 coupled to a first bit line segment 313 extending along a first lateral direction (e.g., Y-direction). The second portion 330 may comprise a plurality of second nominal memory cells 332, 334 coupled to a second bit line segment 333 and a third bit line segment 335 both extending along the first lateral direction. The third bit line segment 335 can be vertically disposed above the first bit line segment 313.

Corresponding to operation 1304 of FIG. 13, the memory circuit 300 may activate a first tracking cell 316, in response to at least one of the first nominal memory cells being selected. The first tracking cell 316 can be disposed next to the first portion 310 of the memory array 302 along a second lateral direction (e.g., X-direction) perpendicular to the first lateral direction. In some embodiments, the first tracking circuit may comprise: a first AND gate, and a first tracking word line coupled to a gate terminal of the first tracking cell. In some embodiments, the memory circuit 300 may receive a first control signal asserted to a first logic state (e.g., "1") when the at least one first nominal memory cell is selected.

Corresponding to operation 1306 of FIG. 13, the memory circuit 300 may activate a second tracking cell 226, in response to at least one of the second nominal memory cells being selected. The second tracking cell 226 can be disposed next to the second portion 330 of the memory array 302 along the second lateral direction. In some embodiments, the second tracking circuit may comprise: a second AND gate, and a second tracking word line coupled to a gate terminal of the second tracking cell. In some embodiments, the memory circuit 300 may receive a second control signal asserted to the first logic state when the at least one second nominal memory cell is selected.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a first portion of a memory array comprising a plurality of first nominal memory cells coupled to a first bit line segment extending along a first lateral direction;
a first tracking cell disposed next to the first portion of the memory array along a second lateral direction perpendicular to the first lateral direction;
a second portion of the memory array comprising a plurality of second nominal memory cells coupled to a second bit line segment and a third bit line segment both extending along the first lateral direction, wherein the third bit line segment is vertically disposed above the first bit line segment;
a second tracking cell disposed next to the second portion of the memory array along the second lateral direction;
a first tracking circuit configured to activate the first tracking cell, in response to at least one of the first nominal memory cells being selected, wherein the first tracking circuit comprises: a first AND gate; and a first tracking word line coupled to a gate terminal of the first tracking cell; and
a second tracking circuit configured to activate the second tracking cell, in response to at least one of the second nominal memory cells being selected, wherein the second tracking circuit comprises: a second AND gate; and a second tracking word line coupled to a gate terminal of the second tracking cell.

2. The memory circuit of claim 1, wherein
the first AND gate has a first input terminal configured to receive a clock signal, and a second input terminal configured to receive a first control signal asserted to a first logic state when the at least one first nominal memory cell is selected; and
the second AND gate has a first input terminal configured to receive the clock signal, and a second input terminal configured to receive a second control signal asserted to the first logic state when the at least one second nominal memory cell is selected.

3. The memory circuit of claim 2, wherein the first AND gate is configured to assert the first tracking word line to the first logic state when the at least one first nominal memory cell is selected, and the second AND gate is configured to assert the second tracking word line to the first logic state when the at least one second nominal memory cell is selected.

4. The memory circuit of claim 2, wherein
the first tracking circuit further comprises:
a first NAND gate; and
a first inverter coupled to a first word line coupled to the at least one first nominal memory cell; and
the second tracking circuit comprises:
a second NAND gate; and
a second inverter coupled to a second word line coupled to the at least one second nominal memory cell.

5. The memory circuit of claim 4, wherein
the first NAND gate has a first input terminal configured to receive a first address signal asserted to the first logic state when the at least one first nominal memory cell is selected, and a second input terminal configured to receive a first signal present on a first tracking bit line coupled to the first tracking cell; and
the second NAND gate has a first input terminal configured to receive a second address signal asserted to the first logic state when the at least one second nominal memory cell is selected, and a second input terminal configured to receive a second signal present on a second tracking bit line coupled to the second tracking cell.

6. The memory circuit of claim 4, wherein a first signal present on the first word line has a first pulse width when the at least one first nominal memory cell is selected, and a second signal present on the second word line has a second pulse width when the at least one second nominal memory cell is selected.

7. The memory circuit of claim 6, wherein the first pulse width is narrower than the second pulse width.

8. The memory circuit of claim 1, wherein the first and second bit line segments are disposed in a first metallization layer, and the third bit line segment is disposed in a second metallization layer above the first metallization layer.

9. A memory circuit, comprising:
a first portion of a memory array comprising a plurality of a first nominal memory cells;
a first bit line coupled to the first nominal memory cells, wherein the first bit line comprises a first bit line segment disposed in a first metallization layer;
a second portion of the memory array comprising a plurality of second nominal memory cells;
a second bit line coupled to the second nominal memory cells, wherein the second bit line comprises a second bit line segment and a third bit line segment disposed in the first metallization layer and a second metallization layer, respectively;
a first tracking cell configured to mimic each of the plurality of first nominal memory cells;
a second tracking cell configured to mimic each of the plurality of second nominal memory cells;
a first tracking circuit configured to activate the first tracking cell, in response to at least one of the first nominal memory cells being selected, wherein the first tracking circuit comprises:

a first AND gate; and a first tracking word line coupled to a gate terminal of the first tracking cell; and a second tracking circuit configured to activate the second tracking cell, in response to at least one of the second nominal memory cells being selected, wherein the second tracking circuit comprises: a second AND gate; and a second tracking word line coupled to a gate terminal of the second tracking cell.

10. The memory circuit of claim 9, wherein the first AND gate has a first input terminal configured to receive a clock signal, and a second input terminal configured to receive a first control signal asserted to a first logic state when the at least one first nominal memory cell is selected; and the second AND gate has a first input terminal configured to receive the clock signal, and a second input terminal configured to receive a second control signal asserted to the first logic state when the at least one second nominal memory cell is selected.

11. The memory circuit of claim 10, wherein the first AND gate is configured to assert the first tracking word line to the first logic state when the at least one first nominal memory cell is selected, and the second AND gate is configured to assert the second tracking word line to the first logic state when the at least one second nominal memory cell is selected.

12. The memory circuit of claim 10, wherein the first tracking circuit further comprises:

a first NAND gate; and a first inverter coupled to a first word line coupled to the at least one first nominal memory cell; and the second tracking circuit comprises:

a second NAND gate; and a second inverter coupled to a second word line coupled to the at least one second nominal memory cell.

13. The memory circuit of claim 12, wherein a first signal present on the first word line has a first pulse width when the at least one first nominal memory cell is selected, and a second signal present on the second word line has a second pulse width when the at least one second nominal memory cell is selected.

14. The memory circuit of claim 13, wherein the first pulse width is narrower than the second pulse width.

15. The memory circuit of claim 12, wherein the first NAND gate has a first input terminal configured to receive a first address signal asserted to the first logic state when the at least one first nominal memory cell is selected, and a second input terminal configured to receive a first signal present on a first tracking bit line coupled to the first tracking cell.

16. The memory circuit of claim 12, wherein the second NAND gate has a first input terminal configured to receive a second address signal asserted to the first logic state when the at least one second nominal memory cell is selected, and a second input terminal configured to receive a second signal present on a second tracking bit line coupled to the second tracking cell.

17. The memory circuit of claim 9, wherein the third bit line segment is vertically disposed above the first bit line segment.

18. A method for operating a memory circuit, comprising:

determining a selection of at least one nominal memory cell of a memory array, wherein the memory array comprises a first portion and a second portion, wherein the first portion comprises a plurality of first nominal memory cells coupled to a first bit line segment extending along a first lateral direction, and the second portion comprises a plurality of second nominal memory cells coupled to a second bit line segment and a third bit line segment both extending along the first lateral direction, wherein the third bit line segment is vertically disposed above the first bit line segment;

activating a first tracking cell by a first tracking circuit, in response to at least one of the first nominal memory cells being selected, wherein the first tracking cell is disposed next to the first portion of the memory array along a second lateral direction perpendicular to the first lateral direction, wherein the first tracking circuit comprises: a first AND gate, wherein the first AND gate has a first input terminal configured to receive a clock signal; and a first tracking word line coupled to a gate terminal of the first tracking cell; and activating a second tracking cell by a second tracking circuit, in response to at least one of the second nominal memory cells being selected, wherein the second tracking cell is disposed next to the second portion of the memory array along the second lateral direction, wherein the second tracking circuit comprises: a second AND gate, wherein the second AND gate has a first input terminal configured to receive the clock signal; and a second tracking word line coupled to a gate terminal of the second tracking cell.

19. The method of claim 18, comprising:

receiving a first control signal asserted to a first logic state when the at least one first nominal memory cell is selected; and receiving a second control signal asserted to the first logic state when the at least one second nominal memory cell is selected.

20. The method of claim 18, wherein the first tracking circuit further comprises:

a first NAND gate; and a first inverter coupled to a first word line coupled to the at least one first nominal memory cell; and the second tracking circuit comprises:

a second NAND gate; and a second inverter coupled to a second word line coupled to the at least one second nominal memory cell.

* * * * *